US006781479B2

(12) United States Patent
Ikada et al.

(10) Patent No.: US 6,781,479 B2
(45) Date of Patent: Aug. 24, 2004

(54) SURFACE ACOUSTIC WAVE DUPLEXER AND COMMUNICATION APPARATUS

(75) Inventors: Katsuhiro Ikada, Moriyama (JP); Tatsuro Nagai, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 6 days.

(21) Appl. No.: 10/207,194

(22) Filed: Jul. 30, 2002

(65) Prior Publication Data

US 2003/0020562 A1 Jan. 30, 2003

(30) Foreign Application Priority Data

Jul. 30, 2001 (JP) ........................................ 2001-230512
May 30, 2002 (JP) ........................................ 2002-157999

(51) Int. Cl.[7] ............................. H01L 41/00; H03H 9/00
(52) U.S. Cl. ....................... 333/133; 333/126; 333/129; 333/132; 333/134
(58) Field of Search ................................ 333/126, 129, 333/132–134, 193–196

(56) References Cited

U.S. PATENT DOCUMENTS

| | | | |
|---|---|---|---|
| 5,448,209 A | | 9/1995 | Hirai et al. |
| 5,525,942 A | * | 6/1996 | Horii et al. ................. 333/134 |
| 5,554,960 A | * | 9/1996 | Ohnuki et al. .............. 333/132 |
| 5,864,260 A | | 1/1999 | Lee |
| 6,222,426 B1 | * | 4/2001 | Komazaki et al. .......... 333/133 |
| 6,313,715 B1 | * | 11/2001 | Bergmann et al. .......... 333/133 |
| 6,326,863 B1 | * | 12/2001 | Kushitani et al. ........... 333/128 |
| 6,351,195 B1 | | 2/2002 | Atokawa et al. |
| 6,489,860 B1 | * | 12/2002 | Ohashi ....................... 333/133 |
| 6,489,861 B2 | * | 12/2002 | Noguchi et al. ............ 333/133 |
| 6,525,623 B2 | * | 2/2003 | Sridharan et al. .......... 333/128 |
| 6,608,534 B2 | * | 8/2003 | Kushitani et al. ........... 333/126 |

FOREIGN PATENT DOCUMENTS

| | | |
|---|---|---|
| GB | 2 371 414 A | 7/2002 |
| JP | 02-069012 | 3/1990 |
| JP | 05-167388 | 7/1993 |
| JP | 05-167389 | 7/1993 |
| JP | 11-186872 A | 7/1999 |
| JP | 2001-127503 A | 5/2001 |

* cited by examiner

Primary Examiner—Michael Tokar
Assistant Examiner—Khai Nguyen
(74) Attorney, Agent, or Firm—Keating & Bennett, LLP

(57) ABSTRACT

A surface acoustic wave duplexer includes a branching section having a plurality of surface acoustic wave filters provided on a first electrode pattern on the front surface of a multi-layer substrate. An antenna terminal, a transmission terminal, and a receiving terminal are provided on peripheral portions of a fourth electrode pattern on the rear surface of the multi-layer substrate, and are connected to the branching section. A matching stripline disposed on a third electrode pattern in an intermediate layer of the multi-layer substrate, and connected to the antenna terminal is arranged such that it is grounded to at least one side other than the side opposite the side where the antenna terminal is located.

14 Claims, 16 Drawing Sheets

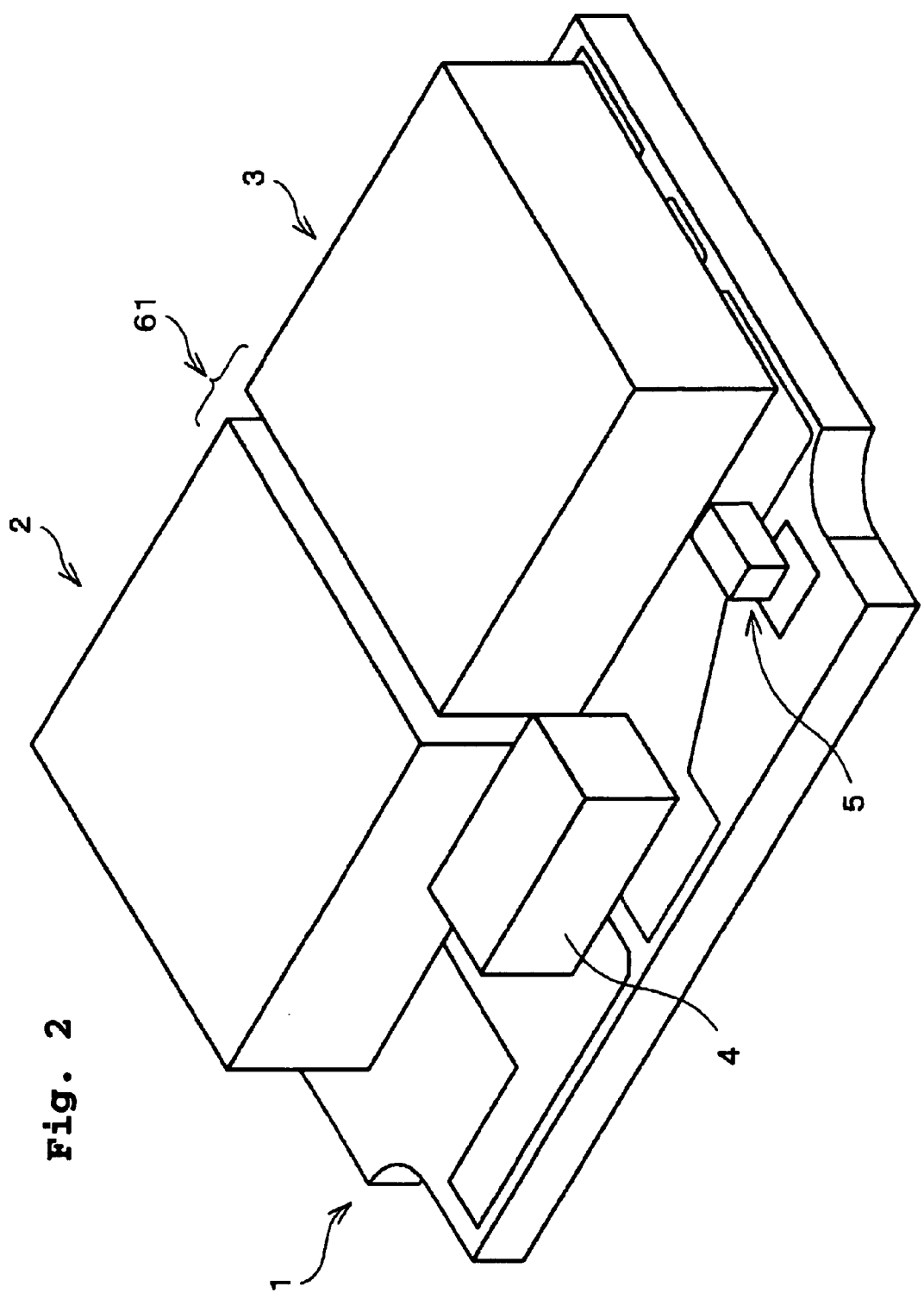

SURFACE ACOUSTIC WAVE DUPLEXER AND COMMUNICATION APPARATUS

BACKGROUND OF THE INVENTION

1. Field of the Invention

The present invention relates to surface acoustic wave (hereinafter abbreviated as SAW) duplexers having an impedance matching circuit at a coupling section between a plurality of SAW filters and an antenna terminal, and communication apparatuses including such SAW duplexers.

2. Description of the Related Art

Recently, multiple-band portable telephones including two or more communication systems have been examined as highly functional mobile communication apparatuses such as portable terminals. Since a plurality of communication systems are integrated into one portable terminal, its components need to be compact and highly functional. Therefore, the use of SAW filters, which is effective for compactness, has been examined for dual filters in which two filters having different pass-band frequencies are integrated, and for duplexers, such as antenna duplexers.

Japanese Unexamined Patent Application Publication No. 02-69012 discloses such a duplexer in which a SAW-filter chip is inserted into a sealable case for maintaining airtightness. This publication describes an advantage that easier handling and more compactness are expected than with a conventional dielectric filter because the sealable case provides a shield effect and the sealable case of the SAW filter does not need to be soldered to a substrate.

In addition, since the duplexer described in this publication uses an inductor as a branching circuit functioning as an impedance matching circuit, and the inductor has a shorter line length than a conventional stripline defined by a distributed constant line, an area occupied by the branching circuit is made smaller. Therefore, in addition to the above-described effect, this can make the duplexer more compact. In this publication, the inductor is mounted on the substrate rear surface to make the duplexer compact.

Japanese Unexamined Patent Application Publication No. 05-167388 discloses a duplexer which uses a band-pass filter including a plurality of SAW resonators. The publication describes as one structure of a duplexer according to its second embodiment that an inductor is inserted between a connection point of transmission and receiving signals and the ground as an impedance matching circuit.

In addition, as another duplexer, Japanese Unexamined Patent Application Publication No. 05-167389 discloses a duplexer which can be made as compact as possible while maintaining a satisfactory isolation. The publication discloses in its sixth embodiment that three external signal terminals are disposed at three sides, and grounded portions are disposed at both sides of each signal terminal to prevent signals from leaking.

In a duplexer using the above-described conventional SAW filter, however, since the duplexer has been made more compact, and the distance between terminals such as an antenna terminal, a transmission terminal, and a receiving terminal, has been made short, a problem is that a sufficient isolation cannot be obtained between terminals.

In Japanese Unexamined Patent Application Publication No. 02-69012, each signal terminal is disposed on the same side. In contrast, in Japanese Unexamined Patent Application Publication No. 05-167389, signal terminals are disposed at three sides, and grounded portions are disposed at both sides of each signal terminal to prevent signals from leaking among the signal terminals.

In general, a matching circuit is required at an antenna coupling section of a SAW duplexer. As shown in Japanese Unexamined Patent Application Publication No. 02-69012 and Japanese Unexamined Patent Application Publication No. 05-167388, a parallel inductor is used in some cases. When an inductor is connected to an antenna terminal as a matching circuit, and the other end is connected to the ground as shown in FIG. 1B of Japanese Unexamined Patent Application Publication No. 02-69012, it is convenient for wiring purposes that a ground electrode is disposed at the other side of the antenna terminal.

With the above-described arrangement method, however, a sufficient isolation can not be obtained between the antenna terminal and other terminals, and between the transmission terminal and the receiving terminal.

SUMMARY OF THE INVENTION

In order to overcome the problems described above, preferred embodiments of the present invention provide a SAW duplexer in which an impedance matching circuit is provided at an antenna coupling section and excellent isolation characteristics are provided, and also provide a communication apparatus including such a novel SAW filter.

According to a preferred embodiment of the present invention, a surface acoustic wave duplexer includes a branching section provided on a substrate, the branching section including a plurality of surface acoustic wave filters arranged to perform a branching function for transmission and reception, an antenna terminal, a transmission terminal, a receiving terminal, and a ground terminal each connected to the branching section and provided at a peripheral portion of the substrate, and a stripline having a matching function being arranged such that one end thereof is connected to the antenna terminal and the other end thereof is grounded to at least one side other than a side opposite to a side where the antenna terminal is located.

According to the above-described unique structure, since the plurality of SAW filters are used, the branching function for transmission and receiving is provided. In addition, since the stripline having the matching function and connected to the antenna terminal is provided, matching of an input and output impedance at the antenna terminal is achieved. Therefore, a transmission characteristic for transmission and reception to and from the antenna terminal is greatly improved.

Further, in the above-described unique structure, since the stripline is arranged such that it is grounded to at least one side other than a side opposite to a side where the antenna terminal is located, the deterioration of attenuation from the antenna terminal to the receiving terminal is prevented and minimized, and the deterioration of attenuation in an isolation characteristic from the transmission terminal to the receiving terminal is also prevented and minimized.

The above-described SAW duplexer may be configured such that the substrate is a multi-layer substrate having a plurality of conductive patterns for defining an electric-element circuit and a connecting line, in a thickness direction, and the stripline is part of the conductive patterns, and connected to a grounding conductive pattern provided on the same layer as the conductive patterns.

According to the above-described structure, since the substrate is preferably a multi-layer substrate, compactness is provided and wiring to each terminal can be more flexibly installed. Therefore, interference between terminals is prevented and minimized.

The above-described SAW duplexer may be configured such that the stripline is grounded to the side where the antenna terminal is located.

According to the above-described structure, furthermore, the deterioration of attenuation from the antenna terminal to the receiving terminal is more effectively prevented and minimized, and the deterioration of attenuation in an isolation characteristic from the transmission terminal to the receiving terminal is also more effectively prevented and minimized.

The above-described SAW duplexer may be configured such that the stripline is grounded in an area that is different from an area including the receiving terminal, among two areas into which the substrate is divided by an imaginary line connecting the antenna terminal and the transmission terminal.

According to the above-described structure, further, since the stripline is grounded in the area that is different from the area which has the receiving terminal, among the two areas into which the substrate is divided by an imaginary line connecting the antenna terminal and the transmission terminal, isolation from the antenna terminal to the receiving terminal is more positively maintained at a satisfactory level. Therefore, the above-described structure provides compactness and more effectively achieves an excellent attenuation characteristic.

The above-described SAW duplexer may be configured such that the transmission terminal and the receiving terminal are provided on both corner sections along a first side of the substrate, respectively, and the antenna terminal is provided in a center section of a second side opposite to the first side.

According to the above-described structure, since mutual interference between any two terminals of the antenna terminal, the transmission terminal, and the receiving terminal is prevented and minimized, a satisfactory isolation is more positively obtained between any two of the above terminals.

The above-described SAW duplexer may be configured such that a ground terminal is disposed between any two terminals of the antenna terminal, the transmission terminal, and the receiving terminal.

According to the above-described structure, since mutual interference between any two terminals of the antenna terminal, the transmission terminal, and the receiving terminal is more reliably prevented and minimized by the ground terminal disposed between any two of the terminals, a satisfactory isolation is further more reliably achieved between any two of the above terminals.

The above-described SAW duplexer may be configured such that the stripline has a coil shape. According to the above-described structure, since the stripline preferably has a coil shape, a much smaller space is required for this duplexer because of the great compactness achieved.

In addition, since the coil-shaped stripline also defines an inductor element in the above-described structure, it functions not only as a matching element but also as an element for suppressing harmonic signals. Therefore, the emission of useless harmonic signals from a communication apparatus, such as a portable terminal, is effectively prevented and minimized.

In yet another preferred embodiment of the present invention, a communication apparatus includes one of the above-described surface acoustic wave duplexers.

According to the above-described structure, since the communication apparatus has a compact SAW duplexer having a satisfactory isolation between any two terminals of the antenna terminal, the transmission terminal, and the receiving terminal, compactness is provided and communication characteristics, such as a transfer characteristic, is greatly improved.

As described above, a SAW duplexer according to preferred embodiments of the present invention has a structure in which a branching section having a plurality of SAW filters is provided on a substrate, and a stripline connected to an antenna terminal of the branching section is grounded to at least a side other than the side opposite the side where the antenna terminal is disposed.

Therefore, the above-described structure achieves matching of an antenna terminal connected to SAW filters by use of the stripline while providing compactness, and also provides an excellent attenuation characteristic and an excellent isolation characteristic.

As described above, a communication apparatus according to a preferred embodiment of the present invention has the above-described SAW duplexer. Therefore, since the SAW duplexer is compact and has multiple functions and an excellent transmission characteristic, the structure of the communication apparatus provides an excellent transmission and reception function as well as compactness.

Other features, elements, characteristics and advantages of the present invention will become more apparent from the following detailed description of preferred embodiments thereof with reference to the attached drawings.

BRIEF DESCRIPTION OF THE DRAWINGS

FIG. 2 is a perspective view of the SAW duplexer of FIGS. 1A–1D.

DETAILED DESCRIPTION OF PREFERRED EMBODIMENTS

Figure 1A:
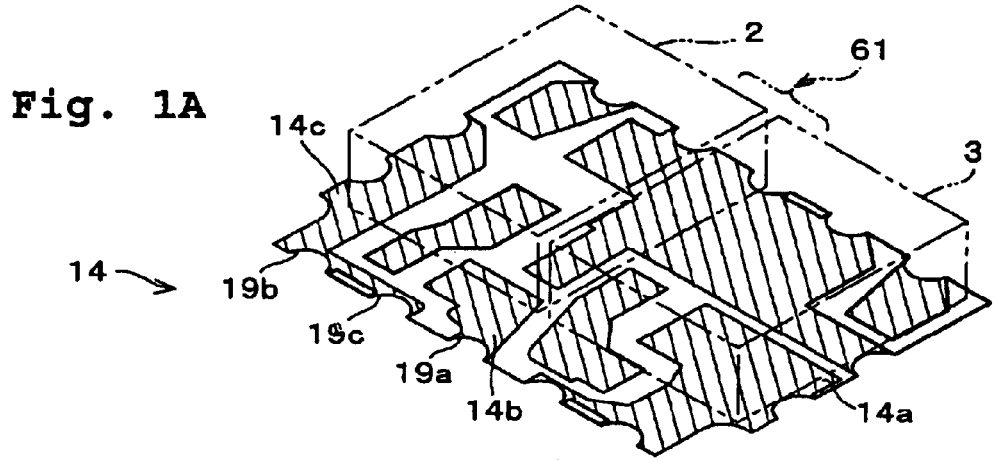
FIG. 1A to FIG. 1D are exploded plan views of the multi-layer substrate of a SAW duplexer according to a first preferred embodiment of the present invention.

Each preferred embodiment of the present invention will be described below by referring to FIG. 1 to FIG. 17.

FIG. 2 is a structural view for describing a SAW duplexer according to a first preferred embodiment of the present invention. As shown in FIG. 2, a SAW duplexer according to preferred embodiments of the present invention is constructed such that a transmission SAW filter 2, a receiving SAW filter 3, an impedance-matching coil 4, and a capacitor 5 are mounted on a substantially rectangular-plate-shaped multi-layer substrate (substrate) 1. The SAW filters 2 and 3 define a branching section 61.

In each of the SAW filters 2 and 3, although not shown, one or a plurality of comb-type electrode sections (interdigital transducers, hereinafter, abbreviated as IDTs) and two reflectors sandwiching the IDT(s) from the right and left (propagation direction of a surface acoustic wave) are disposed on a piezoelectric substrate in the propagation direction of the surface acoustic wave.

The IDT is preferably made of a metal thin film such as an aluminum film, and functions as a surface acoustic wave conversion section which converts input electric signals (alternating current) to surface acoustic waves (elastic energy) to propagate on the piezoelectric substrate, and converts the surface acoustic waves to electric signals and outputs these signals. The reflectors reflect the propagating surface acoustic wave in a direction that is opposite to the direction in which the surface acoustic wave has propagated.

In such an IDT, specifying the length and width of each interdigital electrode finger, the distance between adjacent interdigital electrode fingers, and an interdigital length, which indicates the length of opposing portions of interdigital electrode fingers, obtained when they are engaged with each other determines the signal conversion characteristic and the pass band. In the reflectors, adjusting the width of each of the reflector electrode fingers and their distance determines the reflection characteristic.

In the SAW duplexer, although not shown, a metallic cover is preferably mounted on the multi-layer substrate 1 so as to cover components, such as the SAW filter 2. As shown in a branching circuit diagram of FIG. 3, matching striplines 31, 32, and 33 are preferably built in the multi-layer substrate 1. The striplines 31 and 32 include coil-shaped lines, and the stripline 33 includes a zigzag line that is folded alternately. The striplines 31–33 have a function of an inductive device.

Figure 4:
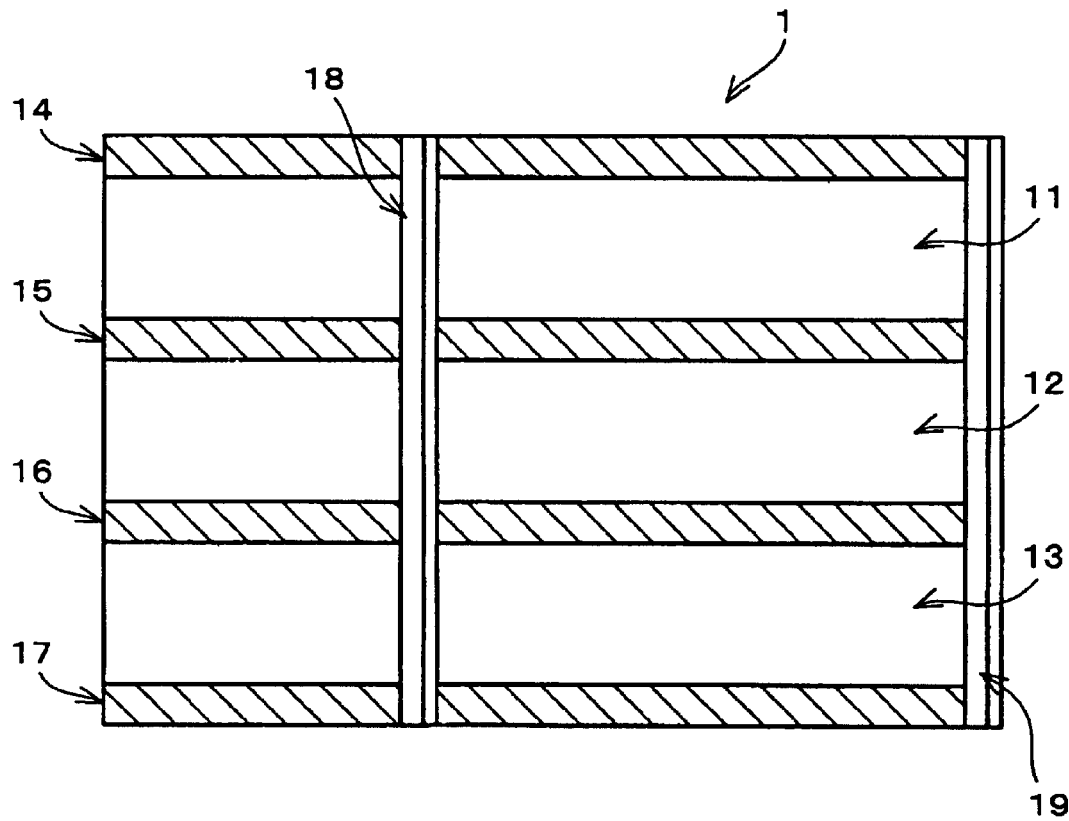
FIG. 4 is an outlined cross-sectional view of the multi-layer substrate of the SAW duplexer of FIGS. 1A–1D.

FIG. 4 shows an example cross-sectional view of the multi-layer substrate 1. The multi-layer substrate 1 preferably has three dielectric layers 11, 12, and 13 in its thickness direction, and is provided with conductive layers 14, 15, 16, and 17 preferably made from copper or aluminum, disposed above and below (in the thickness direction) the three dielectric layers. The dielectric layers 11, 12, and 13 are preferably made from a ceramic oxide, such as $Al_2O_3$, or a glass resin. In the multi-layer substrate 1, the number of layers may be increased or reduced depending on the shape and type of the matching device used.

Figure 1B:
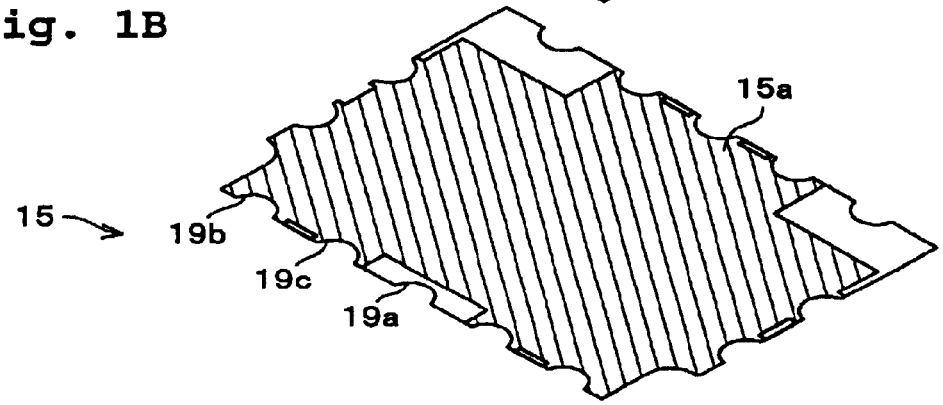
Figure 1C:
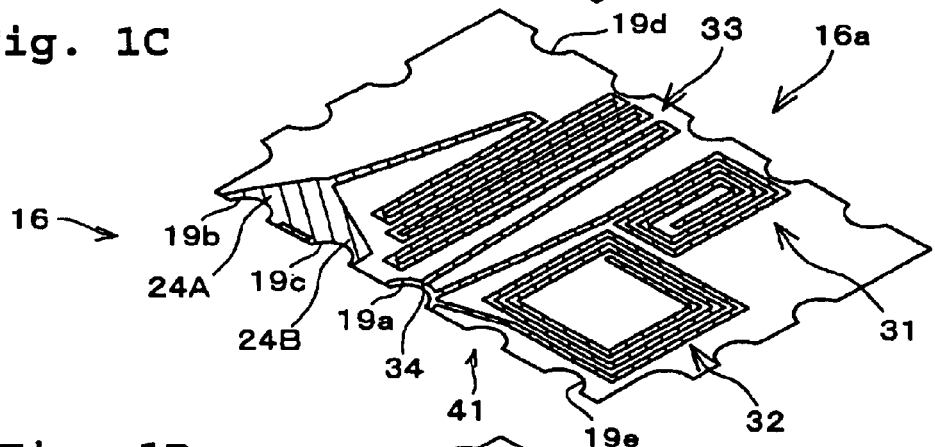

FIG. 1A to FIG. 1D show plan views of the four conductive layers 14, 15, 16, and 17 in the multi-layer substrate 1. On a first conductive layer 14, a first electrode pattern (conductive pattern) 14a for mounting the SAW filters 2 and 3, the coil 4, and the capacitor 5 is provided, as shown in FIG. 1A. On a third conductive layer 16, a third electrode pattern (conductive pattern) 16a provided with the impedance-matching striplines 31, 32, and 33, a connection-point section (common terminal) 34 of the striplines 31, 32, and 33, and ground patterns 24A and 24B connected to the other end side of the stripline 33 is provided, as shown in FIG. 1C.

Figure 1D:
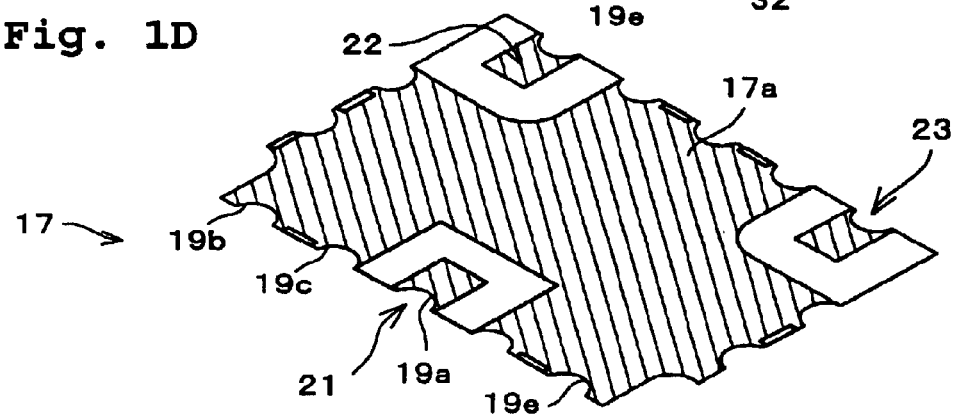
Figure 3:
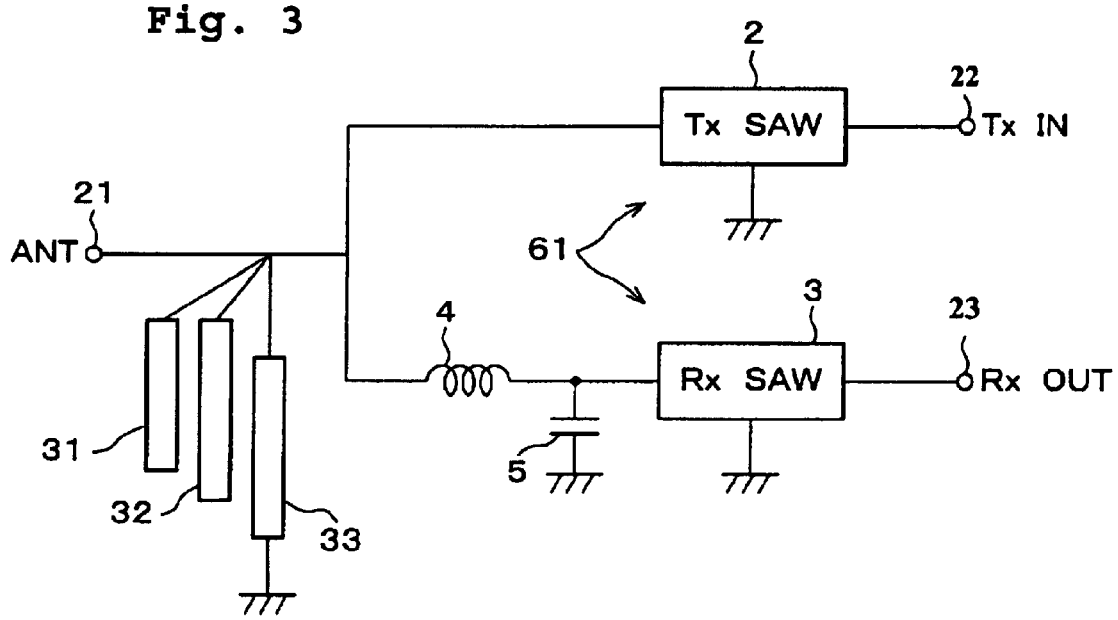
FIG. 3 is a circuit block diagram of the SAW duplexer of FIGS. 1A–1D.

The striplines 31, 32, and 33 are sandwiched by a second electrode pattern (conductive pattern) 15a defining a ground (GND) pattern disposed on a second conductive layer 15 and a ground pattern 17b defining a portion of a fourth electrode pattern (conductive pattern) 17a disposed on a fourth conductive layer 17, in the thickness direction of the multi-layer substrate 1, as shown in FIG. 1B and FIG. 1D.

The first to fourth conductive layers 14 to 17 are electrically connected by a via hole 18 arranged to extend in the thickness direction inside the multi-layer substrate 1 in a pass-through manner, and a through hole 19 formed along the thickness direction outside the multi-layer substrate 1, as shown in FIG. 4.

Figure 5:
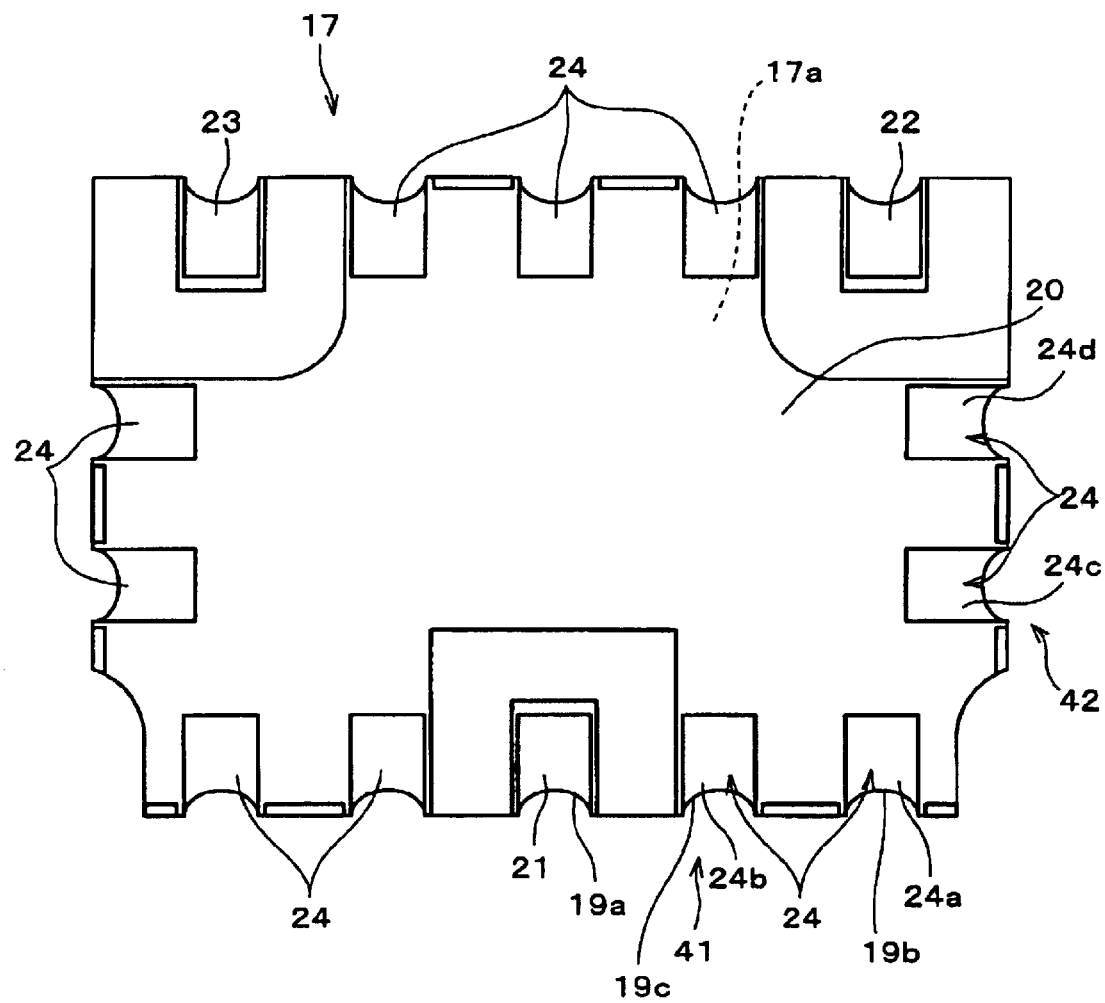
FIG. 5 is a view describing terminals on the rear surface of the multi-layer substrate of the SAW duplexer of FIGS. 1A–1D.

On the fourth conductive layer 17, an antenna terminal 21, a transmission terminal 22, a receiving terminal 23, and ground terminals 24 are disposed along peripheral sections of the substantially rectangular fourth conductive layer 17, defining the fourth electrode pattern 17a, as shown in FIG. 1D. FIG. 5 shows the arrangement of each rear-surface terminal provided on the rear surface (one end surface of the multi-layer substrate 1 in the thickness direction, the rear-surface side of the fourth conductive layer 17 shown in FIG. 1D) of the SAW duplexer. As shown in FIG. 5, a ground pattern 17b on the fourth conductive layer 17 is preferably coated with an insulating material, such as a resist 20, in a predetermined shape at the rear-surface side to define each ground terminal 24.

In such an arrangement of the rear-surface terminals, the antenna terminal 21, the transmission terminal 22, and the receiving terminal 23 are disposed so as to suppress mutual interference. For example, the transmission terminal 22 and the receiving terminal 23 are provided at corner sections along a first long side (a first side) in the substantially rectangular fourth conductive layer 17, and the antenna terminal 21 is provided at a center section along a second long side (a second side) opposing the first long side.

Further, on the rear surface of the conductive layer 17, among the antenna terminal 21, the transmission terminal 22, and the receiving terminal 23, a plurality of, for example, two or three, ground terminals 24 are disposed with the distance between adjacent terminals being substantially equal.

With such an arrangement of the terminals, interference among the antenna terminal 21, the transmission terminal 22, and the receiving terminal 23 more reliably prevented and minimized.

The open-type striplines 31 and 32 for providing attenuation poles in the vicinities of the frequency bands of second and third harmonics of the transmission-side wave, and the stripline 33 having an impedance matching function for an antenna coupling section 14b are preferably disposed on the third conductive layer 16, as shown in FIG. 1C.

These three striplines 31, 32, and 33 are united at the connection-point section 34, and connected through a through hole 19a to the antenna coupling section 14b on the first conductive layer 14 and to the antenna terminal 21 on the fourth conductive layer 17. The antenna coupling section 14b is connected to one of the input and output terminals of each of the SAW filter 2 and the SAW filter 3.

The other end of each of the striplines 31 and 32 is open, and the other end of the stripline 33 is grounded on the same layer, the third conductive layer 16, for example, is connected to the ground patterns 24A and 24B. The ground patterns 24A and 24B are connected to ground terminals 24a and 24b, which are rear-surface terminals, via through holes 19b and 19c, respectively.

Further, the ground patterns 24A and 24B are also connected to a ground pattern 14c on the first conductive layer 14 and to a second electrode pattern 15a, which is a ground pattern on the second conductive layer 15.

The stripline 33 is only connected to the ground patterns 24A and 24B, located at a side 41 which includes the antenna terminal 21, on the third conductive layer 16.

Figure 6:
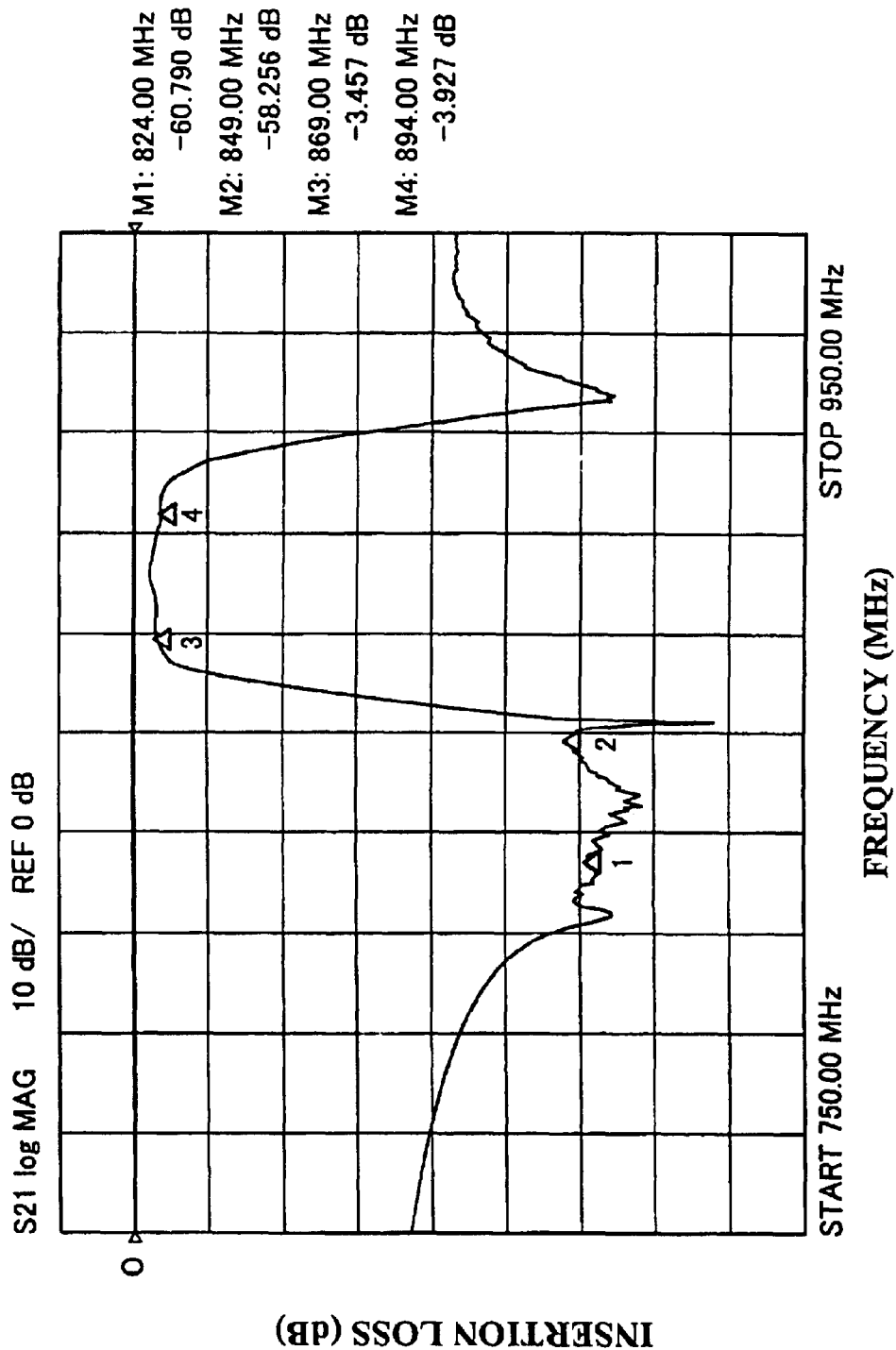
FIG. 6 is a graph showing a pass-band amplitude characteristic from an antenna terminal to a receiving terminal, of the SAW duplexer of FIGS. 1A–1D.
Figure 7:
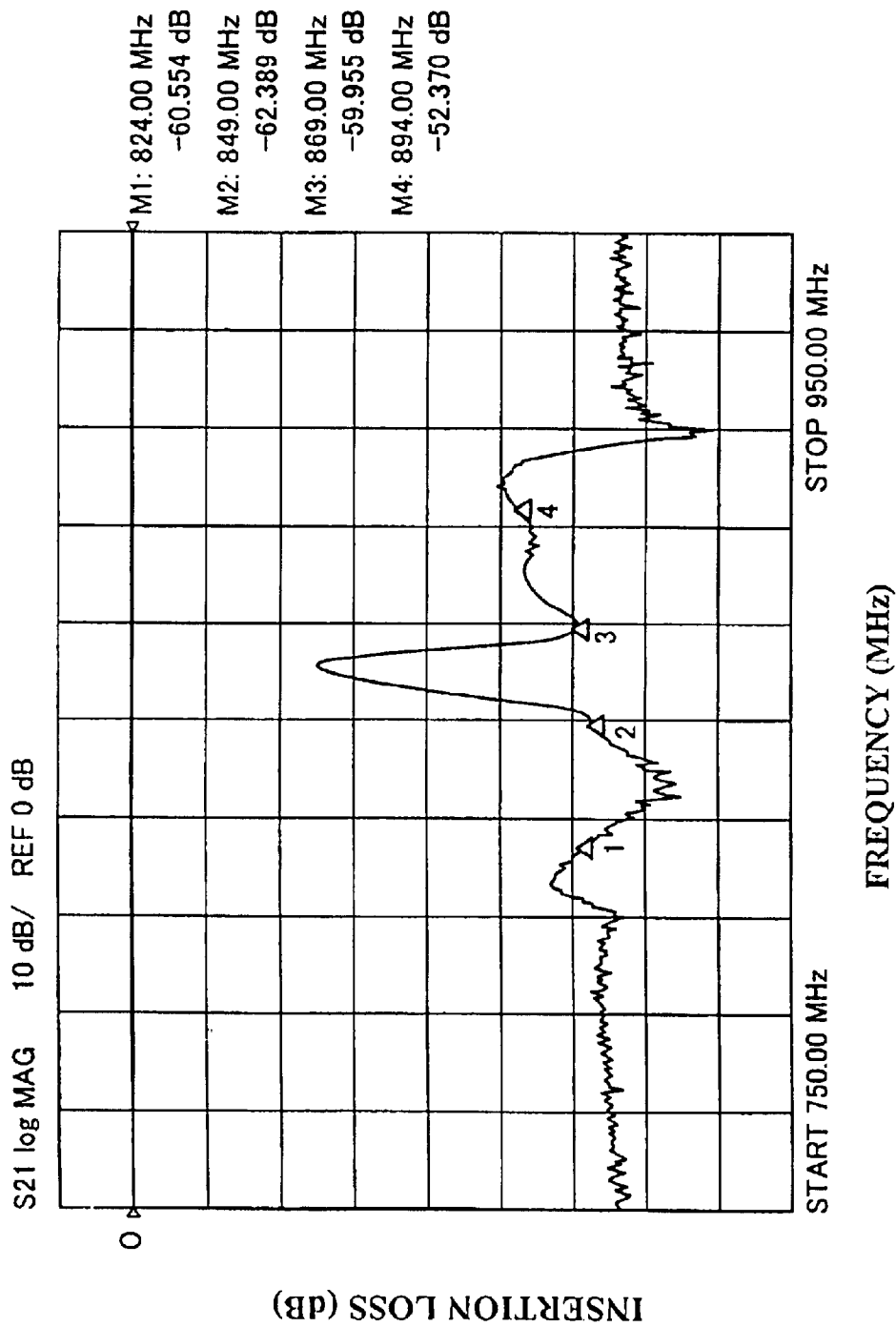
FIG. 7 is a graph showing an isolation characteristic from a transmission terminal to the receiving terminal, of the SAW duplexer of FIGS. 1A–1D.

FIG. 6 and FIG. 7 show characteristics of the AMPS/CDMA SAW duplexer according to the first preferred embodiment of the present invention. The pass band at the transmission side ranges from about 824 MHz to about 849 MHz, and the pass band at the receiving side ranges from about 869 MHz to about 894 MHz. FIG. 6 shows an amplitude characteristic in the vicinity of the pass band from the antenna terminal 21 to the receiving terminal 23. In the characteristic shown in FIG. 6, an attenuation as satisfactory as about 58 dB is obtained at about 849 MHz (Δ2). FIG. 7 shows an isolation characteristic from the transmission terminal 22 to the receiving terminal 23. In the characteristic shown in FIG. 7, an attenuation as satisfactory as about 62 dB is also obtained at approximately 849 MHz (Δ2).

Figure 8:
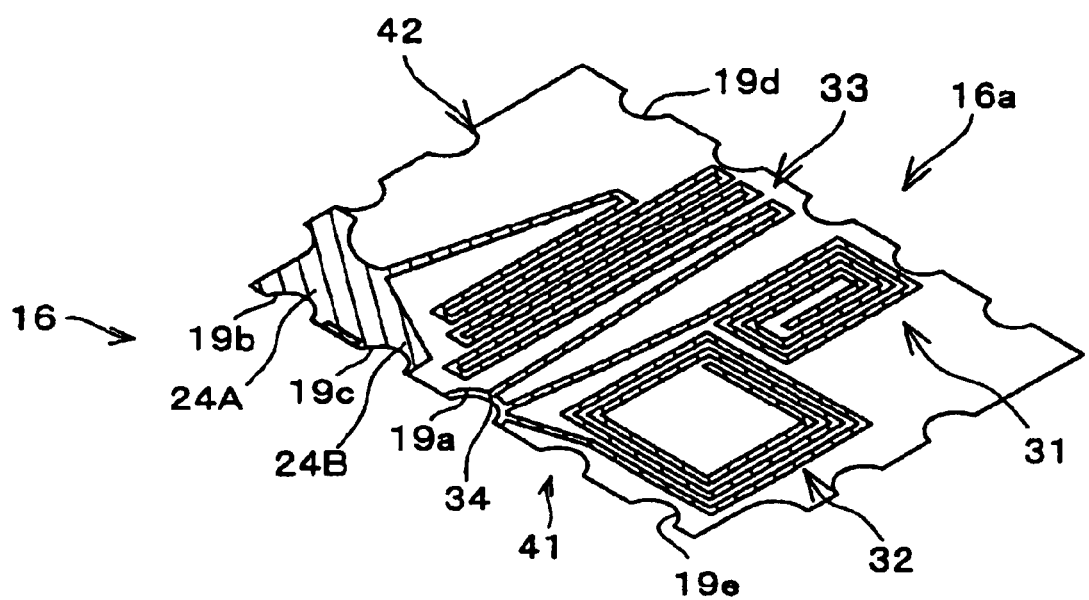
FIG. 8 is a plan showing a modification of striplines related to FIG. 1C.
Figure 9:
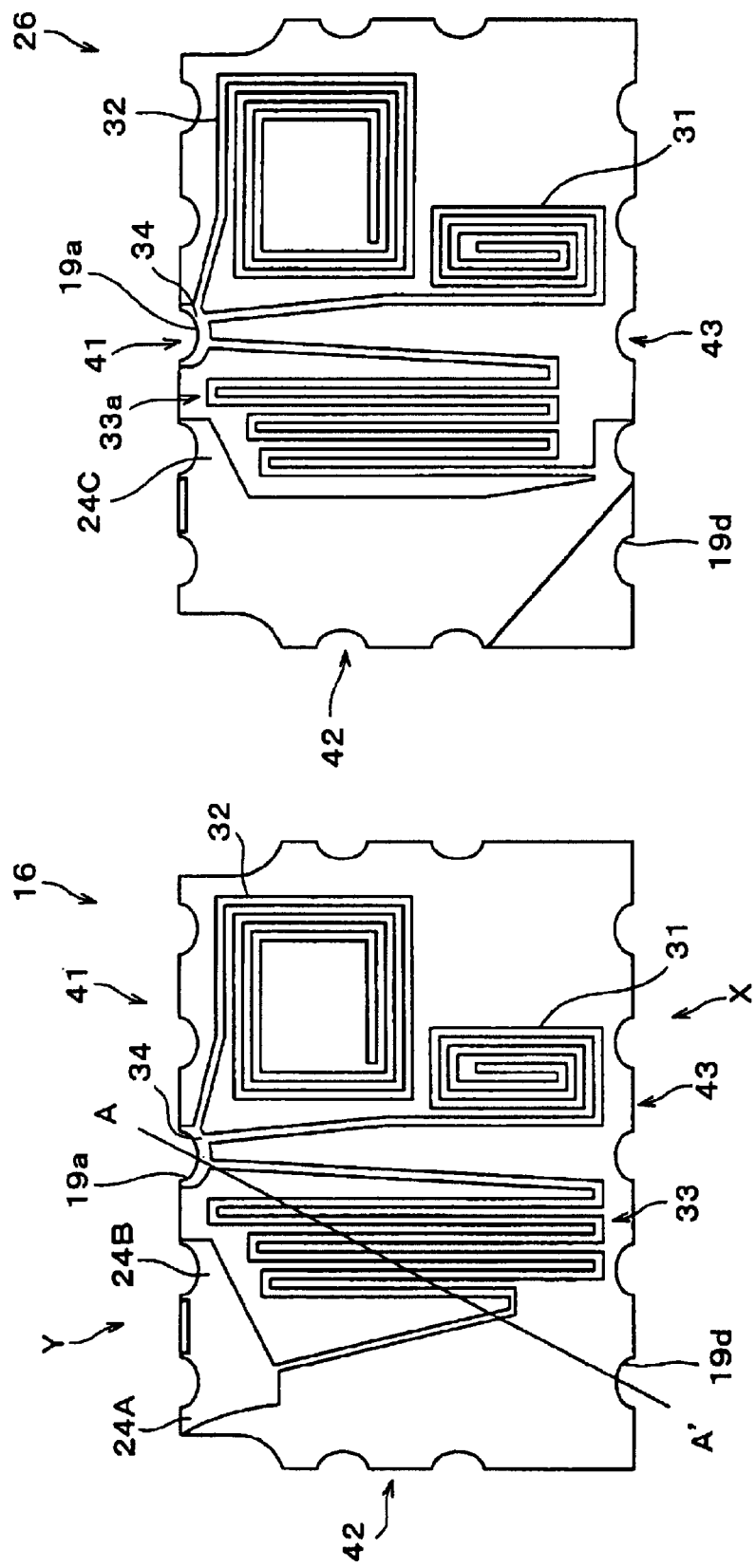
FIG. 9A is a view showing the grounding position of a stripline in a multi-layer substrate according to various preferred embodiments of the present invention.
FIG. 9B indicates a grounding position in a SAW duplexer for comparison.

In the first preferred embodiment, the stripline 33 is grounded to the ground terminal 24a and others on the side 41, where the antenna terminal 21 is located. The present invention is not limited to this example. As shown in FIG. 8, the stripline 33 may be connected to a ground terminal 24c or a ground terminal 24d on a side 42 closer to the transmission terminal 22, which is adjacent to the side 41, in addition to those on the side 41, where the antenna terminal 21 is located. Also in this case, a satisfactory attenuation is obtained.

FIG. 9B shows a SAW duplexer for comparison, which has a stripline 33 ground position that is different from that shown in FIG. 9A, which illustrates a stripline 33 ground position according to a preferred embodiment of the present invention. The comparison SAW duplexer shown in FIG. 9B has the same structure as the duplexer according to the first preferred embodiment described above except that a third conductive layer 26 having a stripline 33a is substituted for the third conductive layer 16. The stripline 33a is connected to ground patterns 24A and 24B as well as to a ground pattern 24C contacting a side 43 opposite the side where the antenna terminal 21 is located, in addition to the sides 41 and 42 described above.

Figure 10:
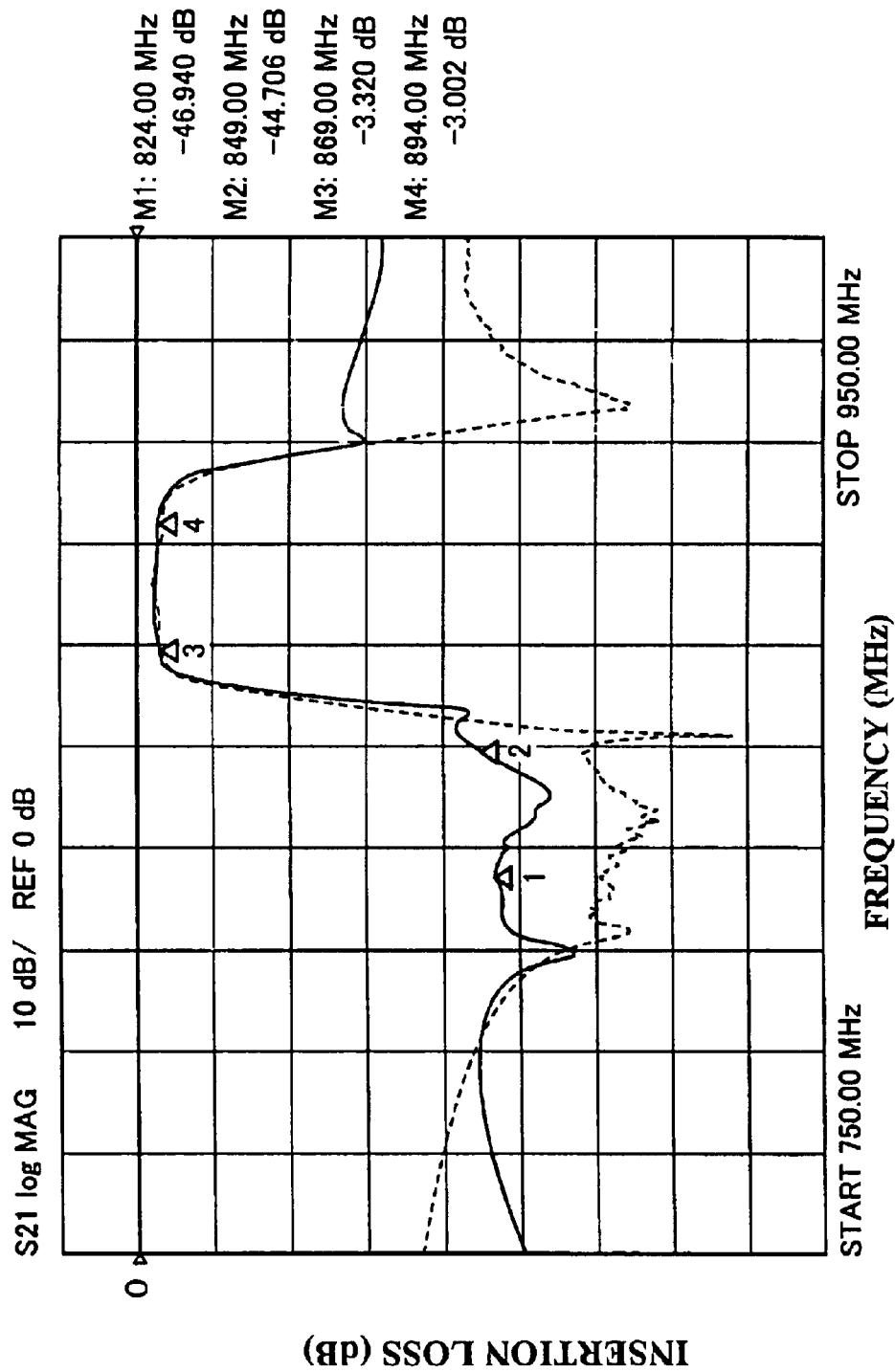
FIG. 10 is a graph showing a pass-band amplitude characteristic from an antenna terminal to a receiving terminal, of the SAW duplexer for comparison.
Figure 11:
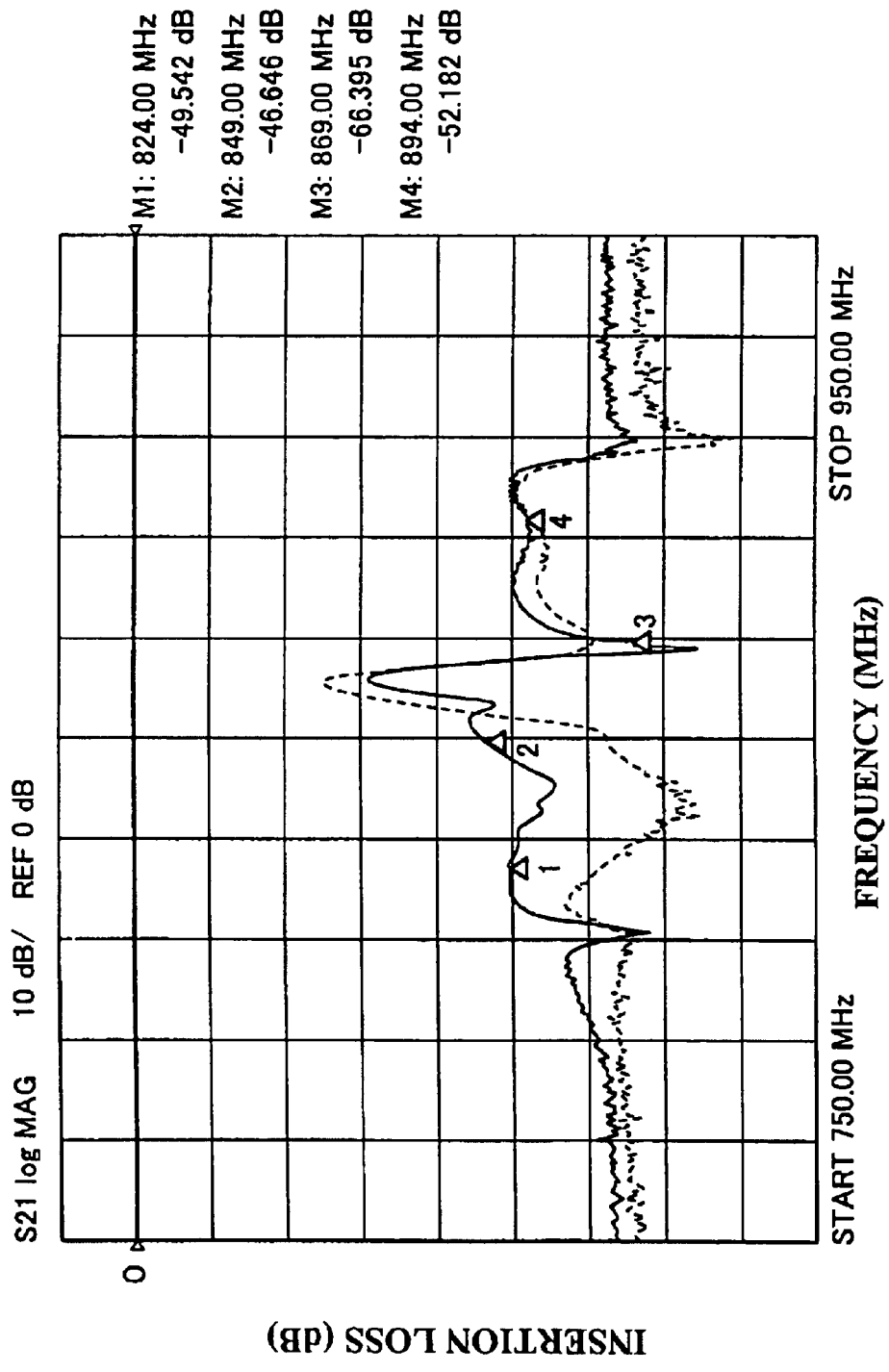
FIG. 11 is a graph showing an isolation characteristic from a transmission terminal to the receiving terminal, of the SAW duplexer for comparison.
Figure 12:
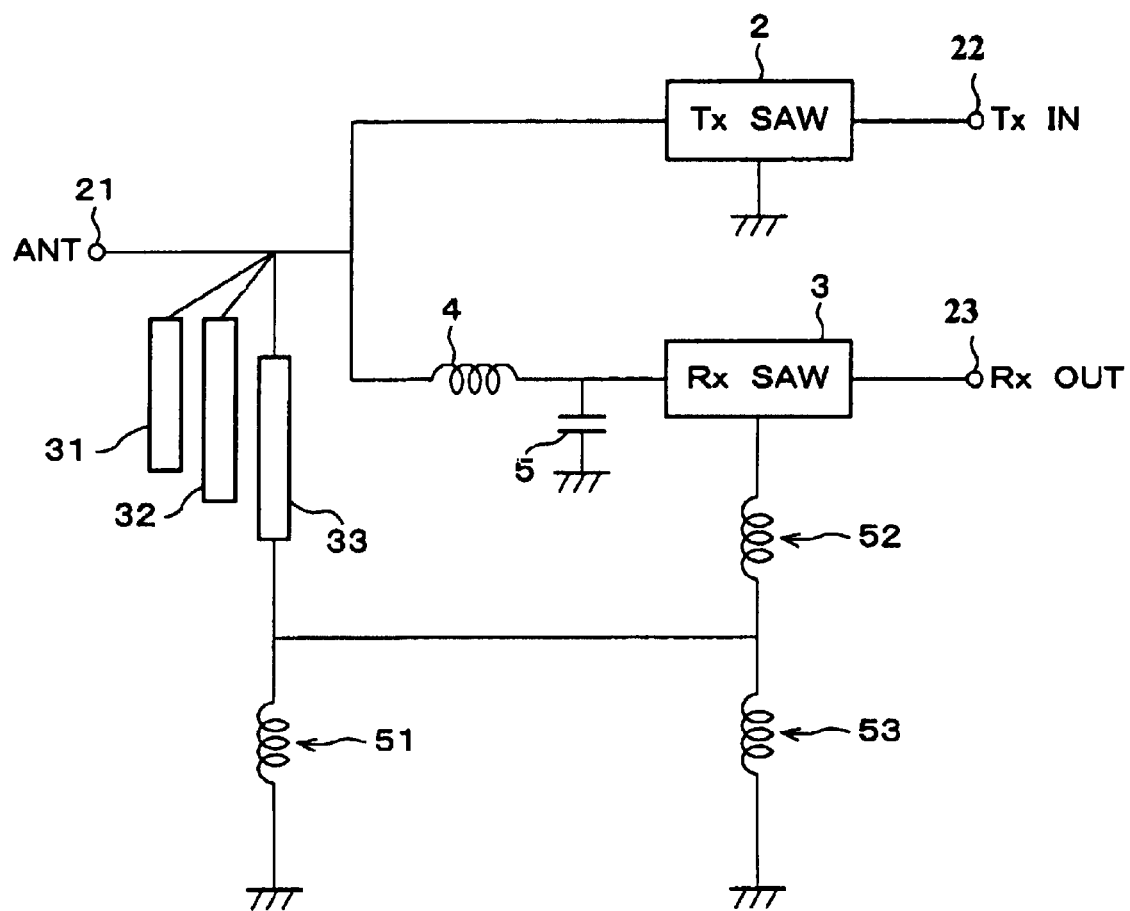
FIG. 12 is a circuit block diagram for describing the deterioration of each characteristic of the SAW duplexer for comparison.

FIG. 10 and FIG. 11 show characteristics of the comparison SAW duplexer. In an amplitude characteristic from an antenna terminal 21 to a receiving terminal 23, shown in FIG. 10, attenuation is reduced to about 45 dB at approximately 849 MHz. In an isolation characteristic shown in FIG. 7, attenuation is reduced to about 47 dB at approximately 849 MHz. The reductions are clearly large, which are about 13 dB with FIG. 6 and about 16 dB with FIG. 7.

Dotted lines shown in FIG. 10 and FIG. 11 indicate the characteristics shown in FIG. 6 and FIG. 7, respectively, for comparison. In the structure shown in FIG. 9B, such as that illustrated in a circuit diagram in FIG. 12, grounding (GND) of each terminal of the duplexer is insufficient for grounding (GND) of a measurement system (communication apparatus such as a portable terminal).

Therefore, grounding wires inside the duplexer have slight inductive components 51, 52, and 53. Since the inductive component 51 connected to the antenna terminal 21 is larger than the inductance component 53 connected to the receiving terminal 23, signal leakage occurs at ground terminals from the antenna terminal 21 to the receiving terminal 23, and thus, attenuation is reduced.

Therefore, when the stripline 33 is disposed so as to be grounded to at least one side other than the side opposite the side where the antenna terminal 21 is located, which defines a common terminal, for example, to the ground terminal 24a, a SAW duplexer having a satisfactory attenuation characteristic in which attenuation is large outside the pass band and an isolation characteristic is excellent is provided.

The first preferred embodiment of the present invention indicates a characteristic example of an antenna duplexer. The same advantages are obtained for the attenuation characteristic of a multi-mode dual SAW filter having a common input terminal and separate output terminals.

A modification of the method for grounding the stripline 33 will be described below. A ground terminal connected to the stripline 33 is connected to the side 41 which is located in an area Y and which includes the antenna terminal 21, on the third conductive layer 16, as shown in FIG. 9A.

The area Y refers to an area which does not include the receiving terminal 23 among two areas X and Y into which the third electrode pattern 16a on the third conductive layer 16 is divided by an imaginary straight line A–A' connecting the antenna terminal 21 and the transmission terminal 22.

According to the above modification, since the ground terminals 24a and 24b connected to the stripline 33 are located in the area Y, which is an area not including the receiving terminal 23 among the two areas X and Y into which the third conductive layer 16 is divided by the imaginary straight line A–A' connecting the antenna terminal 21 and the transmission terminal 22, and are connected to the side 41, which includes the antenna terminal 21, satisfactory attenuation characteristics such as those shown in FIG. 6 and FIG. 7 are obtained.

Figure 13:
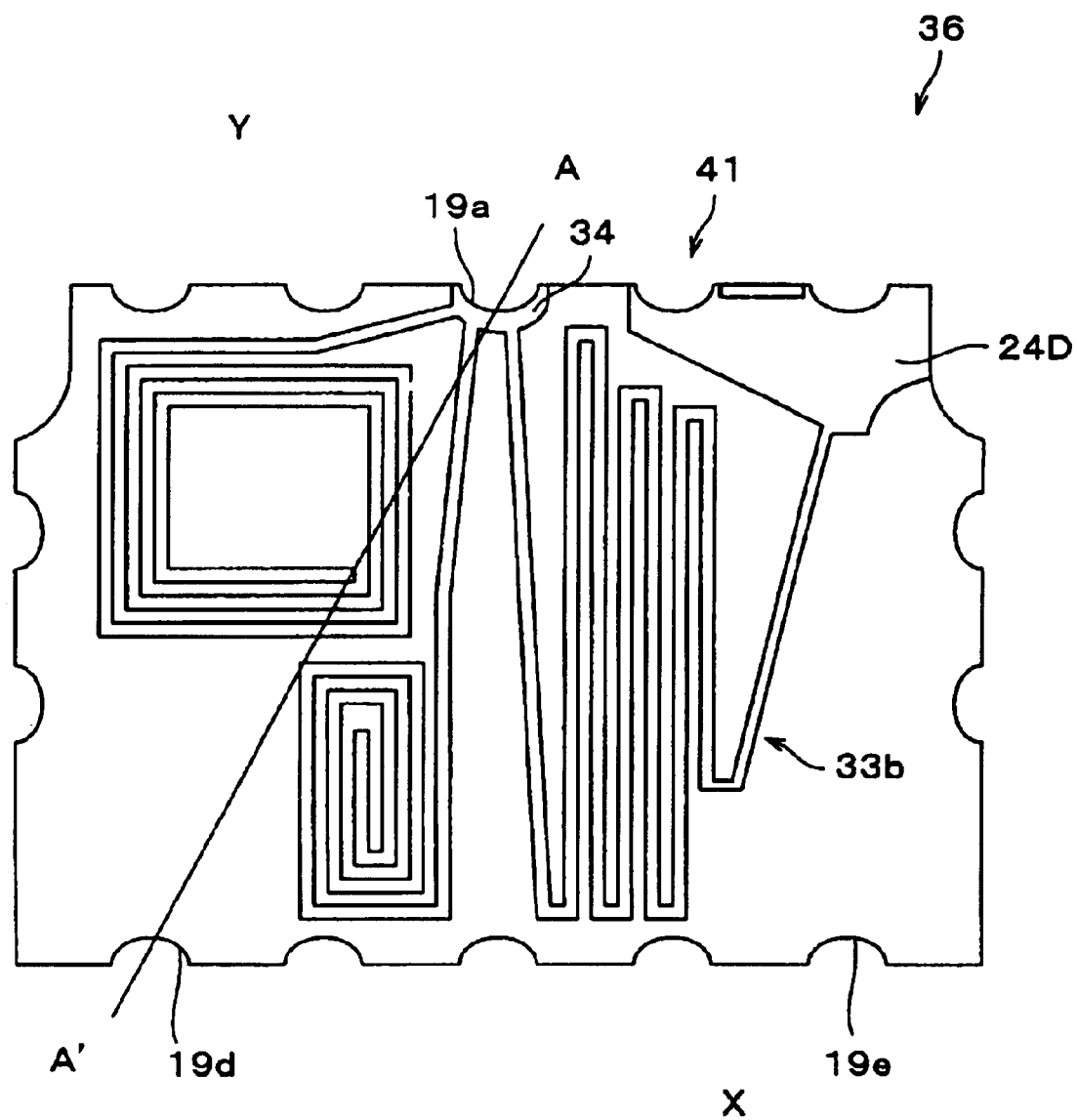
FIG. 13 is a plan of a third conductive layer used for a SAW duplexer for another comparison.

Next, FIG. 13 shows a SAW duplexer for another comparison having the grounding position opposite that in the above modification. In the SAW duplexer for another comparison, a third conductive layer 36 in which a stripline 33b, which corresponds to the stripline 33, is connected to a ground pattern 24D is used. The ground pattern 24D is located in an area X, which is an area that includes a receiving terminal 23 among two areas X and Y into which the third conductive layer 36 is divided by the imaginary straight line A–A' connecting an antenna terminal 21 and a transmission terminal 22, and is positioned on a side 41 which includes the antenna terminal 21.

The SAW duplexer for another comparison shows deterioration in its attenuation characteristics as shown in FIG.

Figure 14:
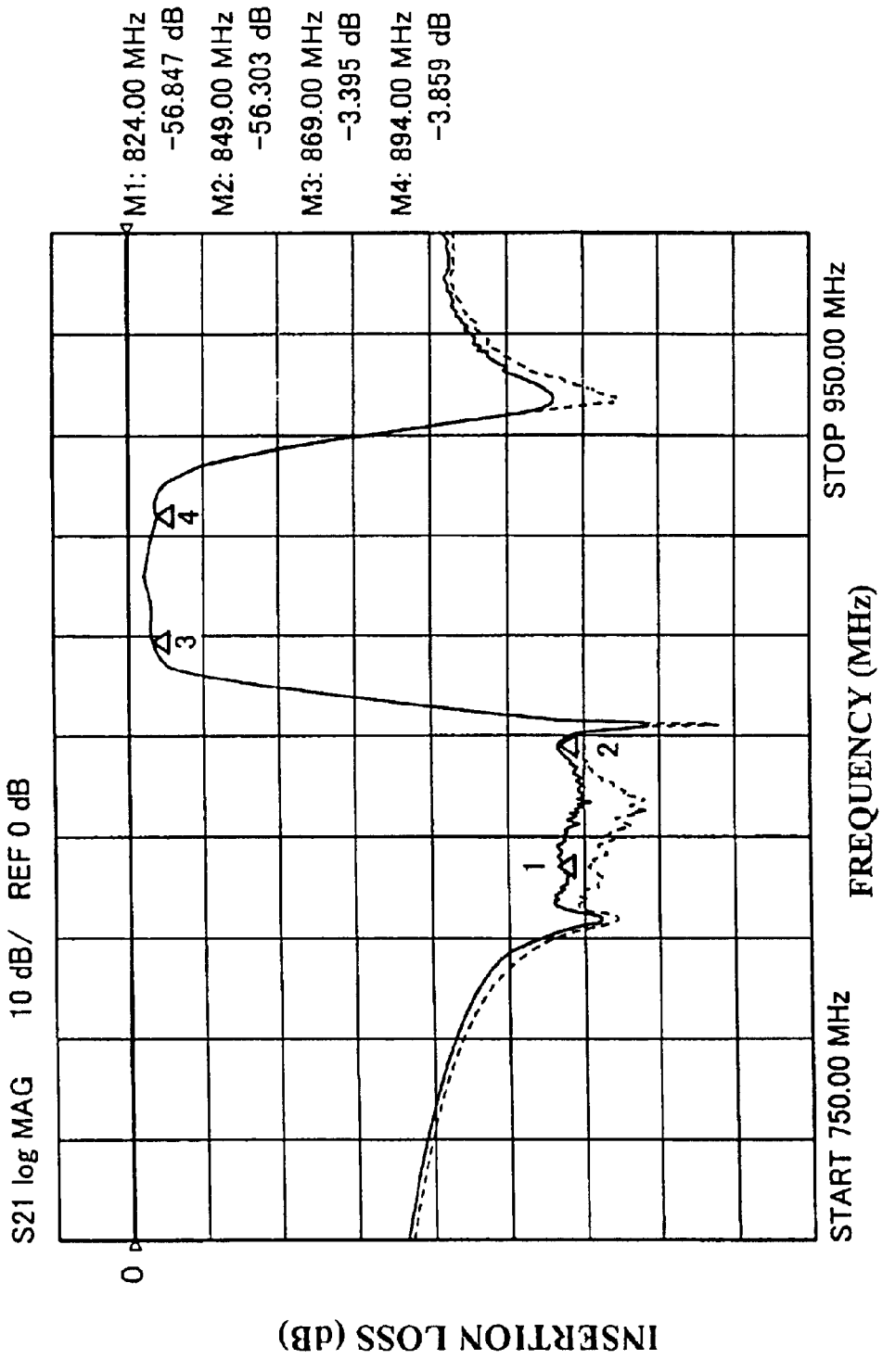
FIG. 14 is a graph showing a pass-band amplitude characteristic from an antenna terminal to a receiving terminal, of the SAW duplexer for another comparison.
Figure 15:
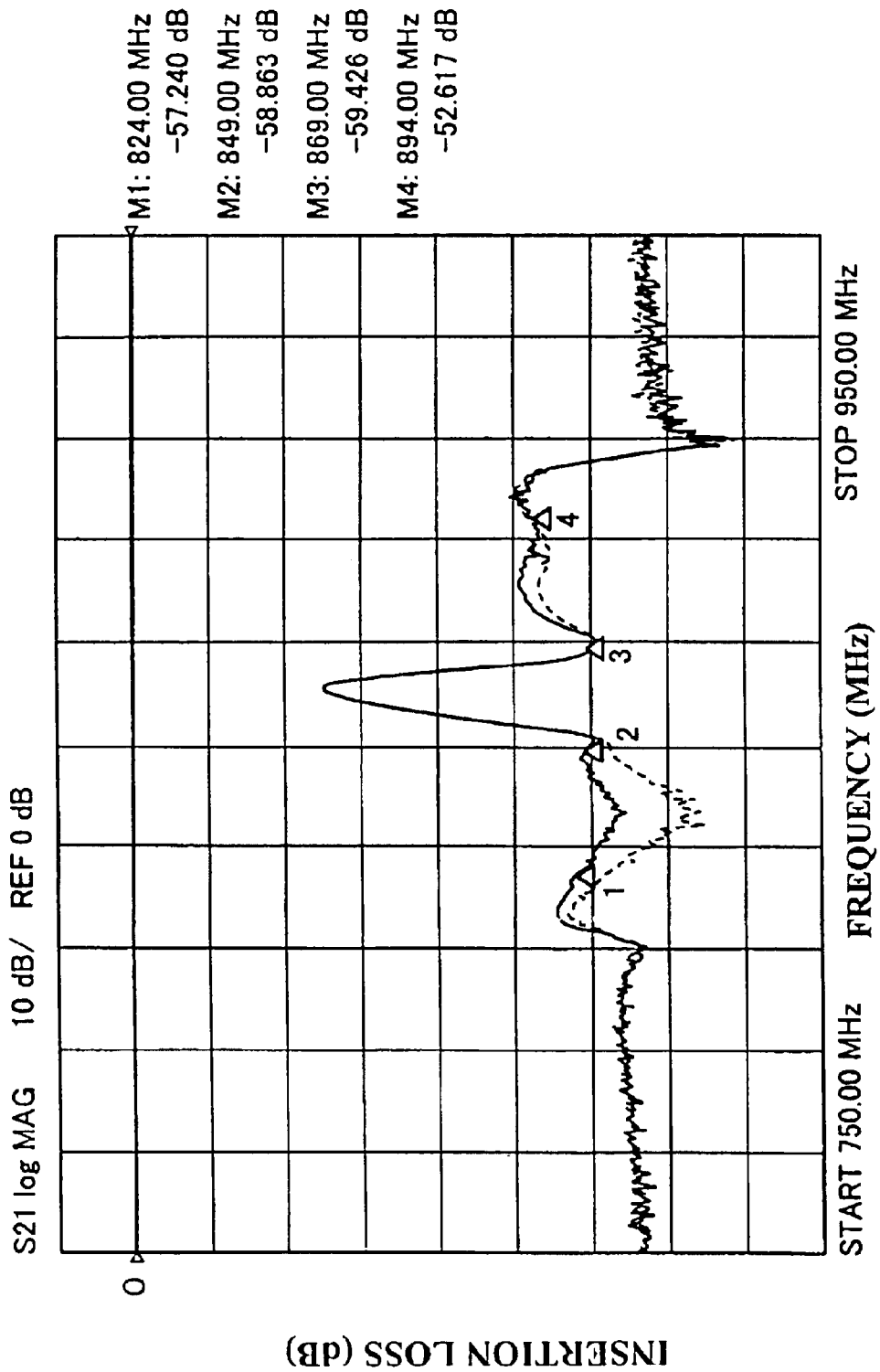
FIG. 15 is a graph showing an isolation characteristic from a transmission terminal to the receiving terminal, of the SAW duplexer for another comparison.

14 and FIG. 15. FIG. 14 shows an amplitude characteristic in the vicinity of a pass band from the antenna terminal 21 to the receiving terminal 23. FIG. 15 shows an isolation characteristic from the transmission terminal 22 to the receiving terminal 23. In the characteristic shown in FIG. 14, an attenuation of about 58 dB is obtained at approximately 849 MHz, which is reduced by about 2 dB from the characteristic of the SAW duplexer shown in FIG. 6. In the characteristic shown in FIG. 15, an attenuation of about 59 dB is obtained at approximately 849 MHz, which is also reduced by about 3 dB from the characteristic of the SAW duplexer shown in FIG. 7. Dotted lines shown in FIG. 14 and FIG. 15 indicate the characteristics shown in FIG. 6 and FIG. 7, respectively, for comparison.

Since the stripline 33 is located in the area Y and grounded to the side 41, which includes the antenna terminal 21, in the above-described SAW duplexer, a large attenuation is obtained outside the pass band and an improved isolation characteristic is also provided.

Figure 16:
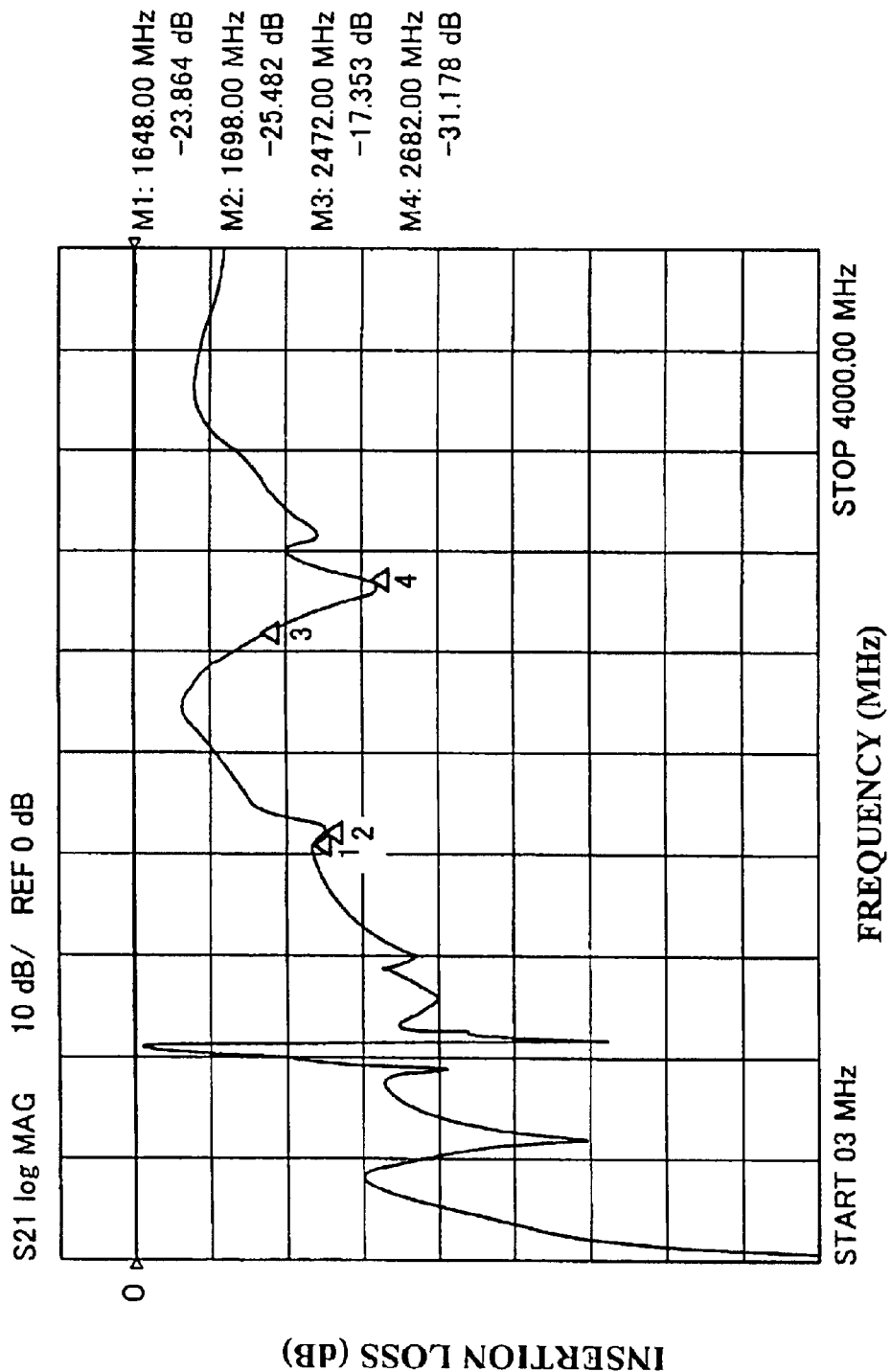
FIG. 16 is a graph showing the spurious-signal characteristic of the transmission side of the SAW duplexer according to the first preferred embodiment of the present invention.

When the open-type striplines 31 and 32 are connected to the antenna terminal 21, it is seen that, as shown in the spurious-signal characteristic of the transmission side, illustrated in FIG. 16, pass-band matching is obtained by capacitive components (capacitor-like characteristics) of the striplines 31 and 22, and in addition, an improved attenuation is obtained (see Δ2 and Δ3 in FIG. 16) at the frequency bands of the harmonics having the frequencies that are approximately two and three times the transmission frequency.

Further, when the short-circuited-type (grounded) stripline 33 is connected to the antenna terminal 21, it is seen that a further large attenuation is obtained (see a minimal point in a higher-frequency side of Δ4 in FIG. 16) at the frequency band of the third harmonics due to the inductor-like characteristic of the stripline 33.

Figure 17:
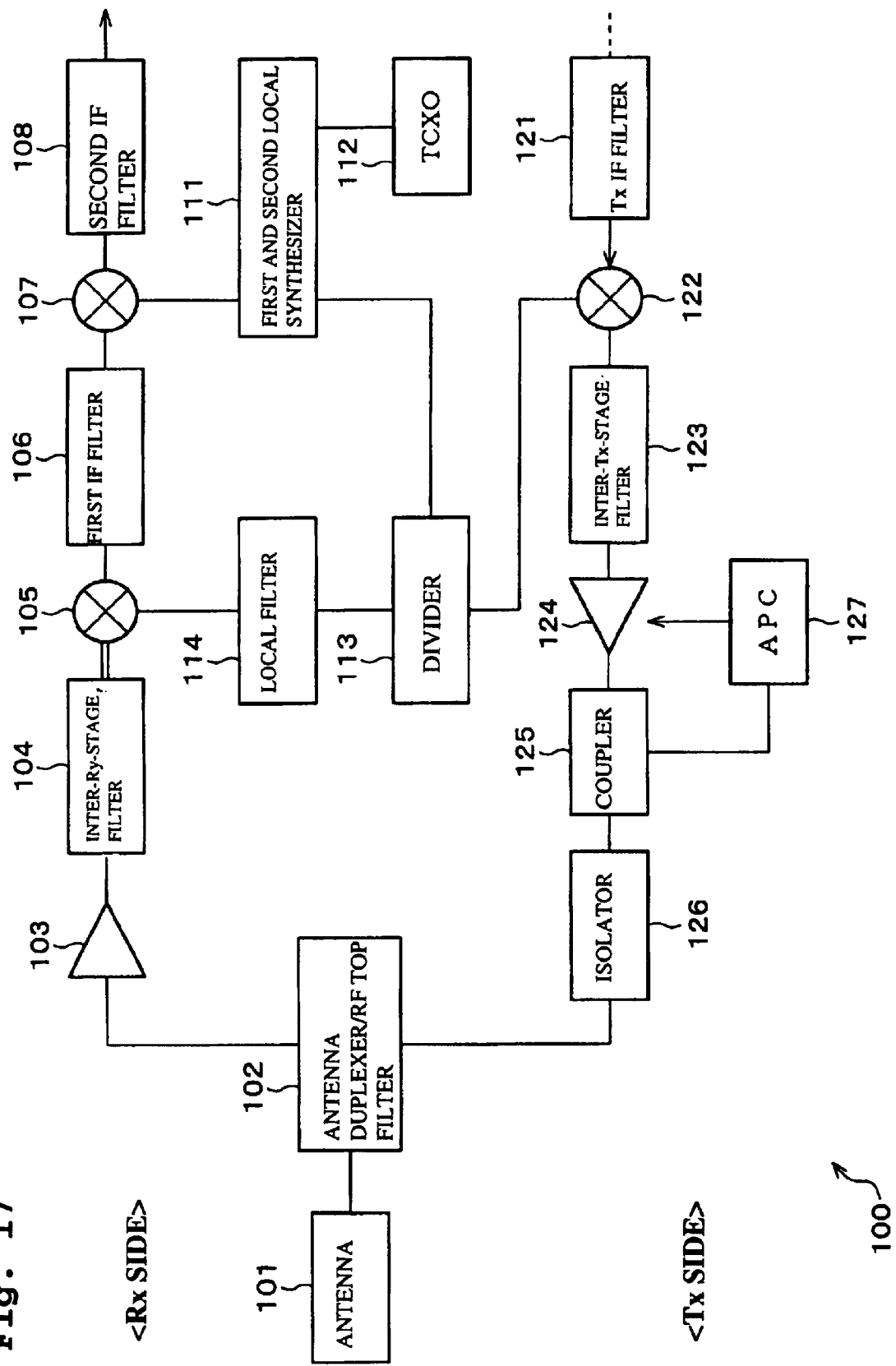
FIG. 17 is a block diagram of a main section of a communication apparatus using a SAW duplexer according to another preferred embodiment of the present invention.

A communication apparatus 100 in which the SAW duplexer described in the first preferred embodiment of the present invention is mounted will be described next by referring to FIG. 17. The communication apparatus 100 includes in a receiver side (Rx side) for receiving, an antenna 101, an antenna duplexer/RF top filter 102, an amplifier 103, an inter-Rx-stage filter 104, a mixer 105, a first IF filter 106, a mixer 107, a second IF filter 108, a first+second local synthesizer 111, a temperature compensated crystal oscillator (TCXO) 112, a divider 113, and a local filter 114. It is preferred that balanced signals be transmitted from the inter-Rx-stage filter 104 to the mixer 105 in order to maintain balance, as indicated by a doubled line in FIG. 17.

The communication apparatus 100 also includes in a transceiver side (Tx side) for transmission, the antenna 101 and the antenna duplexer/RF top filter 102, both of which are shared with, a Tx IF filter 121, a mixer 122, an inter-Tx-stage filter 123, an amplifier 124, a coupler 125, an isolator 126, and an automatic power control (APC) 127.

The SAW duplexer described in the first preferred embodiment of the present invention can be suitably used for the antenna duplexer/RF top filter 102.

Therefore, since the used SAW duplexer is compact and has multiple functions and satisfactory transfer characteristics, the communication apparatus has a satisfactory transmission and receiving function and is compact.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave duplexer comprising:
   a multi-layer substrate including a plurality of layers;
   a branching section provided on said substrate, said branching section including a plurality of surface acoustic wave filters arranged to perform a branching function for transmission and reception;
   an antenna terminal, a transmission terminal, a receiving terminal, and a ground terminal each connected to the branching section and provided at a peripheral portion of the substrate; and
   a stripline having a matching function being provided on a single layer of the plurality of layers such that one end thereof is connected to the antenna terminal and the other end thereof is connected to a ground terminal disposed on at least one side other than a side opposite to a side where the antenna terminal is located.

2. A surface acoustic wave duplexer according to claim 1, wherein the multi-layer substrate includes a plurality of conductive patterns defining an electric-element circuit and a connecting line, in a thickness direction, and the stripline is part of the plurality of conductive patterns, and connected to a grounding conductive pattern provided on the same layer as the plurality of conductive patterns.

3. A surface acoustic wave duplexer according to claim 1, wherein the stripline is grounded to the side where the antenna terminal is located.

4. A surface acoustic wave duplexer according to claim 1, wherein the stripline is grounded in an area that is different from an area including the receiving terminal, among two areas into which the substrate is divided by an imaginary line connecting the antenna terminal and the transmission terminal.

5. A surface acoustic wave duplexer according to claim 1, wherein the transmission terminal and the receiving terminal are provided on both corner sections along a first side of the substrate, respectively, and the antenna terminal is provided in a center section of a second side opposite to the first side.

6. A surface acoustic wave duplexer according to claim 5, wherein a ground terminal is disposed between any two of the antenna terminal, the transmission terminal, and the receiving terminal.

7. A surface acoustic wave duplexer according to claim 1, wherein the stripline has a coil shape.

8. A surface acoustic wave duplexer according to claim 1, further comprising an impedance-matching coil and a capacitor mounted on the substrate and electrically connected to the plurality of surface acoustic wave filters of the branching section.

9. A surface acoustic wave duplexer according to claim 1, wherein reflectors are provided on both sides of the plurality of surface acoustic wave filters of the branching section.

10. A surface acoustic wave duplexer according to claim 1, further comprising a plurality of striplines having the matching function and being built into the substrate.

11. A surface acoustic wave duplexer according to claim 1, wherein the plurality of layers of the multi-layer substrate includes a plurality of stacked dielectric layers and a plurality of conductive patterns disposed the plurality of stacked dielectric layers.

12. A surface acoustic wave duplexer according to claim 1, wherein the matching function is provided by at least three of the striplines.

13. A surface acoustic wave duplexer according to claim 1, wherein the other end of the stripline is connected to a ground pattern.

14. A communication apparatus comprising a surface acoustic wave duplexer according to claim 1.

* * * * *